(12) United States Patent
Agarwal et al.

(10) Patent No.: US 7,714,292 B2
(45) Date of Patent: May 11, 2010

(54) GEIGER MODE AVALANCHE PHOTODIODE

(75) Inventors: Prabhat Agarwal, Brussels (BE); Jan Sonsky, Leuven (BE); Lasse Juhana Kauppinen, Anjalankoski (FI)

(73) Assignee: Koninklijke Philips Electronics N.V., Eindhoven (NL)

( * ) Notice: Subject to any disclaimer, the term of this patent is extended or adjusted under 35 U.S.C. 154(b) by 14 days.

(21) Appl. No.: 12/162,999

(22) PCT Filed: Jan. 17, 2007

(86) PCT No.: PCT/US2007/060621

§ 371 (c)(1),
(2), (4) Date: Aug. 1, 2008

(87) PCT Pub. No.: WO2008/048694

PCT Pub. Date: Apr. 24, 2008

(65) Prior Publication Data

US 2009/0008566 A1 Jan. 8, 2009

Related U.S. Application Data

(60) Provisional application No. 60/766,617, filed on Feb. 1, 2006.

(51) Int. Cl.
*G01T 1/24* (2006.01)
(52) U.S. Cl. ............... 250/370.01; 250/370.14
(58) Field of Classification Search ............ 250/370.01, 250/370.14
See application file for complete search history.

(56) References Cited

U.S. PATENT DOCUMENTS

| 5,583,352 | A | 12/1996 | McIntyre et al. |
| 5,670,383 | A | 9/1997 | Piccone et al. |
| 5,757,057 | A | 5/1998 | Dabrowski |
| 5,923,070 | A | 7/1999 | Yamada |
| 5,923,071 | A * | 7/1999 | Saito .................... 257/458 |
| 6,177,707 | B1 | 1/2001 | Decker et al. |
| 6,426,991 | B1 | 7/2002 | Mattson et al. |
| 6,509,195 | B1 * | 1/2003 | De Rooij et al. ......... 436/172 |
| 6,724,018 | B2 | 4/2004 | Ando et al. |
| 7,254,851 | B2 * | 8/2007 | Salit et al. ................ 5/601 |
| 2002/0000562 | A1 | 1/2002 | Carlson et al. |

(Continued)

FOREIGN PATENT DOCUMENTS

EP 1258924 A1 11/2002

(Continued)

OTHER PUBLICATIONS

Aull et al., Geiger-Mode Avalanche Photodiodes for THree-Dimensional Imaging, Lincoln Laboratory Journal, 2002, pp. 335-350, vol. 13 No. 2.

(Continued)

*Primary Examiner*—David P Porta
*Assistant Examiner*—Mindy Vu (57) ABSTRACT

A avalanche mode photodiode array (102) is fabricated using a silicon on insulator wafer and substrate transfer process. The array includes a plurality of photodiodes (100). The photodiodes (100) include an electrically insulative layer (206), a depletion region (204), and first (208) and second (210) doped regions. An interconnection layer (212) includes electrodes (214, 216) which provides electrical connections to the photodiodes. The photodiode array (102) is carried by a handle wafer (217).

34 Claims, 8 Drawing Sheets

U.S. PATENT DOCUMENTS

| | | | |
|---|---|---|---|
| 2002/0139970 A1* | 10/2002 | Iwanczyk et al. | 257/21 |
| 2004/0245592 A1 | 12/2004 | Harmon et al. | |
| 2005/0205930 A1* | 9/2005 | Williams, Jr. | 257/347 |
| 2005/0209530 A1 | 9/2005 | Pflueger | |
| 2006/0231742 A1* | 10/2006 | Forsyth | 250/214 R |

FOREIGN PATENT DOCUMENTS

| | | |
|---|---|---|
| EP | 1258927 B1 | 8/2005 |
| EP | 1755171 A1 | 2/2007 |
| GB | 2143373 A | 2/1985 |
| JP | 10233525 A | 9/1998 |
| WO | 2004008537 A2 | 1/2004 |
| WO | 2004027879 A2 | 4/2004 |
| WO | 2005106971 A1 | 11/2005 |

OTHER PUBLICATIONS

Bertone et al., Overview of photo counting detectors based on CMOS processed Single Photon Avalanche Diodes (SPAD), InGaSa's, and novel Hybrid (Tube + APD) detectors, Apr. 2005, 10 pages.

Cova et al., Evolution and Prospect of Single-Photon Avalanche Diodes and Quenching Circuits, Workshop on Single Photon Detectors, Mar. 31-Apr. 1, 2003, 37 pages.

Deng et al., Amorphous Silicon Based Solar Cells, Jul. 30, 2002, pp. 1-62.

Dessein et al., Substrate Transfer: Enabling Technology for RF Applications, IEEE, 2003, pp. 15.4.1-15.4.4.

Gramsch, et al., Measurement of the Depth of Interaction of an LSO Scintillator Using a Planar Process APD, IEEE Transactions on Nuclear Science, Jun. 2003, pp. 307-312, vol. 50, No. 3.

Hamamatsu, Technical Information SD-28 Characteristics an use of SiAPD (Avalanche Photodiode), Aug. 2001, pp. 1-12.

John Kelliher, EE/3351 Fundamentals of Optical Communications, presentation, on or about downloaded Aug. 2005, pp. 1-32.

Moloney et al., Large-Area Geiger-Mode Avalanche Photodiodes for Short-Haul Plastic Optical Fibre Communication, SPIE, Mar. 2003, pp. 438-445, vol. 4876.

Niclass et al., Toward a 3-D Camera Based on Single Photon Avalanche Diodes, IEEE Journal of Selected Topics in Quantum Electronics, Jul./Aug. 2004, pp. 796-802, vol. 10, No. 4.

Niclass, et al., 6.7 A CMOS Single Photon Avalanche Diode Array for 3D Imaging, IEEE International Solid-State Circuits Conference, Feb. 16, 2004, 10 pages.

A. Nepomuk Otte, Presentation Outline, downloaded on or about Dec. 2005, pp. 1-11.

Perkinelmer, Avalanche Photodiodes: A User's Guide, 1998-2003, 8 pages.

Rochas et al., Low-Noise Silicon Avalanche Photodiodes Fabricated in Conventional CMOS Technologies, IEEE Transactions on Electron Devices, Mar. 2003, pp. 387-394, vol. 49, No. 3.

Rochas et al., First Fully Integrated 2-D Array of SinglePhoton Detectrs in Standard CMOS Technology, IEEE Photonics Technology Letters, Jul. 2003, pp. 963-965, vol. 15, No. 7.

Spinelli et al., Physics and Numerical Simulation of Single Photon Avalanche Diodes, IEEE Transactions on Electron Devices, Nov. 1997, pp. 1931-1943, vol. 44, No. 11.

Webb et al., Single Photon Detection with Avalanche Photodiodes, Bulletin of the American Physical Society, 1970, p. 813, vol. 15.

Zappa et al., Pushing technologies: Single-photon Avalanche Diode Arrays, SPIE Int. Symposium on Astronomical Telescopes & Instrumentation, Jun. 2004, pp. 1-11.

Otte et al., Prospects of Using Silicon Photomultipliers for the Astroparticle Physics Experiments EUSO and Magic, Nuclear Science Symposium Conference Recod, 2004 IEEE, Oct. 2004, pp. 1044-1048.

* cited by examiner

GEIGER MODE AVALANCHE PHOTODIODE

CROSS REFERENCE TO RELATED APPLICATIONS

This application claims the benefit of U.S. provisional application Ser. No. 60/766,617 filed Feb. 1, 2006, which is incorporated herein by reference.

DESCRIPTION

The present invention relates to the field of photodetectors, and more particularly to avalanche mode photodiodes. It finds particular application in radiation detectors for medical imaging equipment, as well as in other situations in which relatively fast and efficient photodetection is required.

Geiger-mode avalanche photodiodes are solid-state light detectors which typically have sensitivity sufficient to detect individual photons and produce signals in the sub-nanosecond range. See, e.g., Webb and McIntyre, *Single Photon Detection with Avalanche Photodiodes*, Bulletin of the American Physical Society, vol. 15, p. 813 (1970); Rochas, et al., *First Fully Integrated 2-D Array of Single-Photon Detectors in Standard CMOS Technology*, IEEE Phot. Tech. Lett., vol. 15, no. 6, p. 963 (2003).

Geiger mode devices, which are sometimes referred to as single photon avalanche diodes (SPADs), are similar to conventional avalanche photodiodes. Typically, however, they are biased at voltages which are on the order of ten to twenty percent (10 to 20%) above the breakdown voltage. This state can be maintained until an avalanche event is triggered by the generation of an electron-hole pair in the depletion layer, for example by an incident photon. A quenching circuit such as a resistor or active circuitry is used to quench the avalanche process and return the device to the sensitive state.

While these photodiodes have proven useful, there remains room for improvement. In many existing photodiode implementations, incident light having a relatively shorter wavelength (e.g., photons having the wavelength in the blue end of the visible spectrum) is preferentially absorbed in the highly doped top layer of the device, typically in about the first 200 nanometers (nm). As a result, device quantum efficiency is reduced, especially at these relatively shorter wavelengths.

Moreover, carriers generated in the highly doped region must diffuse to the edge of the depletion region in order to initiate the avalanche process. The diffusion time can limit the speed of the device, particularly in the blue regime. Another limitation occurs when the devices are used in arrays, for example to facilitate the measurement of photon flux. In such arrays, the area occupied by optical isolation between the elements of the array, the device electrodes and the quenching circuit reduces the area efficiency of the device.

Aspects of the present invention address these matters, and others.

According to a first aspect of the present invention, an avalanche photodiode includes a semiconductor depletion region, an anode, and a cathode. Incident photons having a wavelength in the blue end of the visible spectrum are absorbed in the depletion region so as to generate charge carriers. The charge carriers undergo impact ionization in the depletion region so as to generate an avalanche current in the photodiode.

According to another aspect of the present invention, a method of manufacturing an array of avalanche photodiodes uses a silicon on insulator wafer which includes a substrate, a silicon layer, and a buried oxide layer disposed physically between the substrate and the silicon layer. The method includes forming a plurality of avalanche photodiodes in the silicon layer, where the photodiodes include an anode, a cathode, and a depletion region. The method also includes forming a plurality of electrodes in electrical communication with the anodes and cathodes of respective photodiodes, where the plurality of electrodes are disposed on a side of the silicon layer which is opposite the buried oxide layer, and removing the substrate, whereby the photodiodes are illuminated through the buried oxide layer.

According to another aspect of the present invention, a photodiode array is produced using a silicon on insulator wafer. The photodiode array is produced using a process which includes forming a plurality of avalanche photodiodes in the silicon layer of the silicon on insulator wafer, forming a plurality of electrodes in electrical communication with the anodes and cathodes of respective photodiodes, attaching a handle wafer to the silicon on insulator wafer, and removing the substrate, whereby the photodiodes are illuminated through the buried oxide layer. The photodiodes include an anode, a cathode, and a depletion region, the plurality of electrodes are disposed on a side of the photodiodes opposite the buried oxide layer, and the electrodes are disposed physically between the handle wafer and the photodiodes.

According to another aspect of the present invention, an avalanche photodiode includes a first doped semiconductor region which forms a cathode of the photodiode, a second doped semiconductor region which forms an anode of the photodiode, and a third semiconductor region in optical communication with a light receiving face of the photodiode, and an interconnection layer including a first electrode in electrical communication with the first doped semiconductor region and a second electrode in electrical communication with the second doped semiconductor region. Substantially all of the third semiconductor region is depleted when the photodiode is operated in the avalanche mode. The third semiconductor region is disposed physically between the interconnection layer and the light receiving face.

According to another aspect of the present invention, an apparatus includes an examination region, an object support adapted to support an object under examination in the examination region, and a radiation detector array. The detector array includes an array of avalanche photodiodes and a radiation sensitive face which faces the examination region. The photodiodes include an anode, a cathode, and a depletion region. The detector array also includes an interconnection layer including a plurality of electrodes which provide electrical connections to the photodiodes. Photons absorbed in the depletion region of a photodiode generate charge carriers, and the charge carriers undergo impact ionization in the depletion region of the photodiode so as to generate an avalanche current in the photodiode. The interconnection layer is disposed on a side of the photodiode array which is opposite the radiation receiving face.

Those skilled in the art will appreciate still other aspects of the present invention upon reading and understanding the attached figures and description.

The present invention is illustrated by way of example and not limitation in the figures of the accompanying drawings, in which like references indicate similar elements and in which.

Those skilled in the art will recognize that, for clarity and ease of explanation, various features in the Figures are not drawn to scale.

Figure 1:
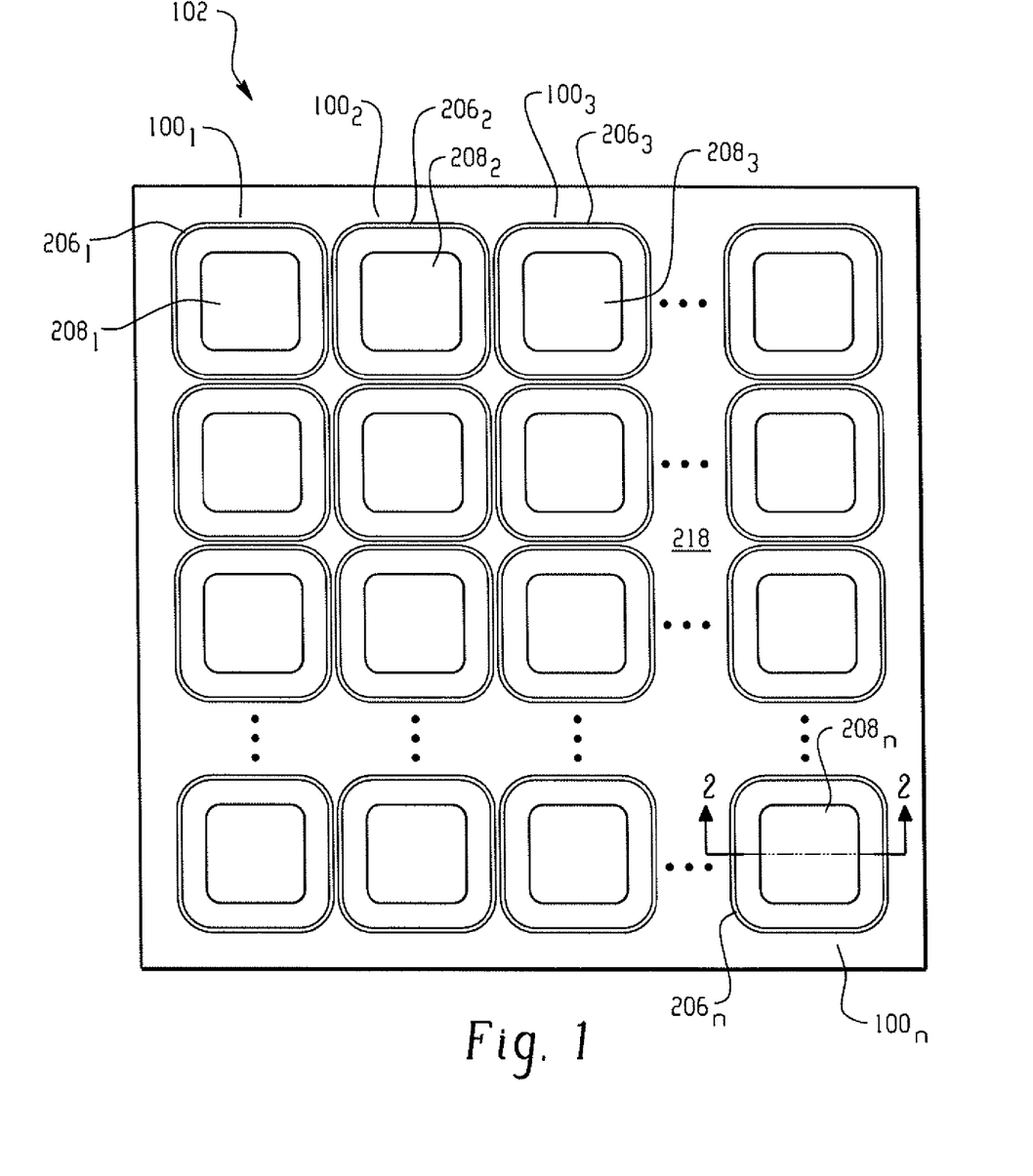
FIG. 1 is a top view of a photodiode array.
Figure 2:
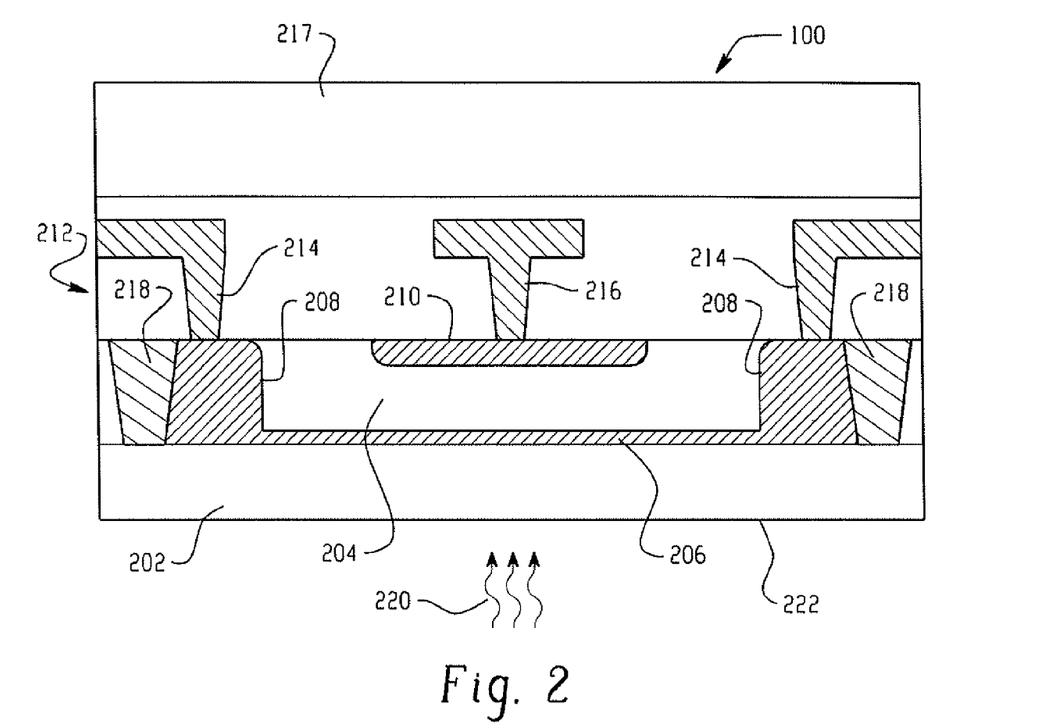
FIG. 2 is a cross sectional view of a photodiode through the line 2-2 shown in FIG. 1.

With reference to FIGS. 1 and 2, a photodiode array 102 includes a plurality of back illuminated avalanche photodiodes $100_1$, $100_2$, $100_3$ ... $100_n$. While a two-dimensional array is illustrated, other configurations such as one-dimensional arrays, irregular arrays, and single photodiodes are also contemplated.

Turning now to FIG. 2, the photodiodes 100 receive incident light 220 through a light receiving face (222). An electrically insulating layer 202 such as a layer of silicon oxide has a thickness preferably chosen to maximize the light transmission therethrough, for example a thickness in the range of about 100 to 300 nanometers (nm). For light having a wavelength of 400 nm, for example, a layer having a thickness of 200 nm has a transmission coefficient of approximately eighty percent (80%) from air. Other wavelengths and layer thicknesses are also contemplated; the insulating layer 202 may also be omitted.

A depletion layer 204 having a thickness of approximately 100-500 nm is fabricated from a layer of a lightly doped semiconductor such as silicon. The dopant functions primarily to reduce the effect of variations in the semiconductor material, it being understood that the depletion layer 204 is depleted of carriers during operation of the device. An intrinsic (i.e., not intentionally doped) semiconductor may also be used.

The photodiode 100 may also be processed to reduce the effects of potentially detrimental lattice imperfections such as dangling bonds at the interface between the insulating layer 202 and the depletion region 204. In one implementation, a p-type doped layer 206 at the interface between the depletion layer 204 and the insulating layer 202 having a thickness of approximately 5 to 15 nm is provided. The doped layer 206 thickness is preferably selected to reduce the effects of imperfections at the interface without substantially absorbing incident photons 220, particularly those having a wavelength in the blue end of the visible spectrum, or shorter. The dopant preferably extends into the insulating layer 202. As dopant concentration typically follows a Gaussian curve, the peak concentration is advantageously located at or near the interface, or slightly to the insulting layer 202 side of the interface. Other techniques, such as chemical passivation, are also contemplated. The doped or passivation layer 206 may also be omitted.

A first region 208 of the silicon layer is p-type doped and forms the anode of the photodiode 100, while a second doped region 210 is n-type doped and forms the cathode. Together, the depletion layer 204 and first 208 and second 210 doped regions form a pπn, pvn, or pin photodiode. To further reduce the effects of dangling bonds, the first doped region 208 and the layer 206 preferably cooperate to prevent the depletion region 204 from reaching the insulating layer 202 or the isolation regions 218. Note that the doping of the doped layer 206 and the implant regions 208, 210 may also be reversed, in which case the first region 208 forms the cathode of the photodiode and the second region 210 forms the anode.

A backend interconnection layer 212 having a thickness of several micrometers (μm) includes a first electrode 214 electrically connected to the p-doped region 208. While two electrodes are shown, it will be appreciated that both are connected to the first doped region; one of the electrodes may be omitted. A second electrode 216 is electrically connected to the n-doped region 210. A quenching resistor made from polysilicon or other suitable material (not shown) can be included in the backend layer 212. A carrier substrate or handle wafer 217 fabricated from glass or other suitable material has a thickness of about 1 millimeter (mm). An isolation region 218 such as an isolation trench isolates the photodiode 100 from adjacent photodiodes or other devices.

Each photodiode 100 preferably has an area of about 400 to 2500 μm², although other areas are also contemplated. Where the objective is to obtain a signal indicative of the photon flux received the photodiodes, the outputs of the various photodiodes 100 in the array 102 are advantageously summed to produce an output signal indicative of the photon flux received by the array 102.

Figure 3A:
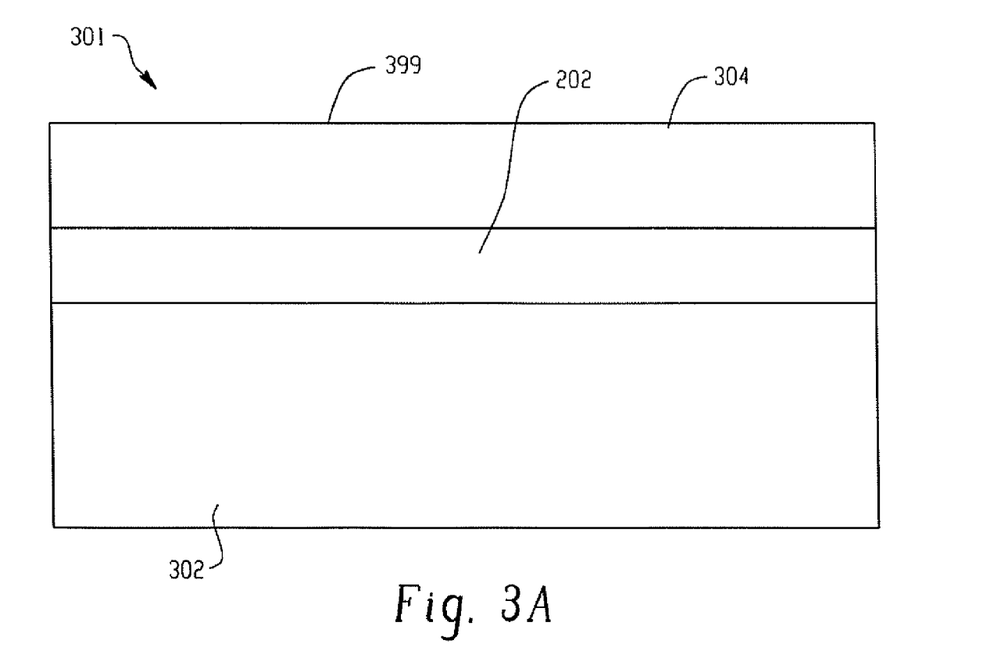
FIGS. 3*a*, 3*b*, 3*c*, 3*d*, 3*e*, and 3*f* are cross sectional views depicting a photodiode at various stages during its fabrication.
Figure 3B:
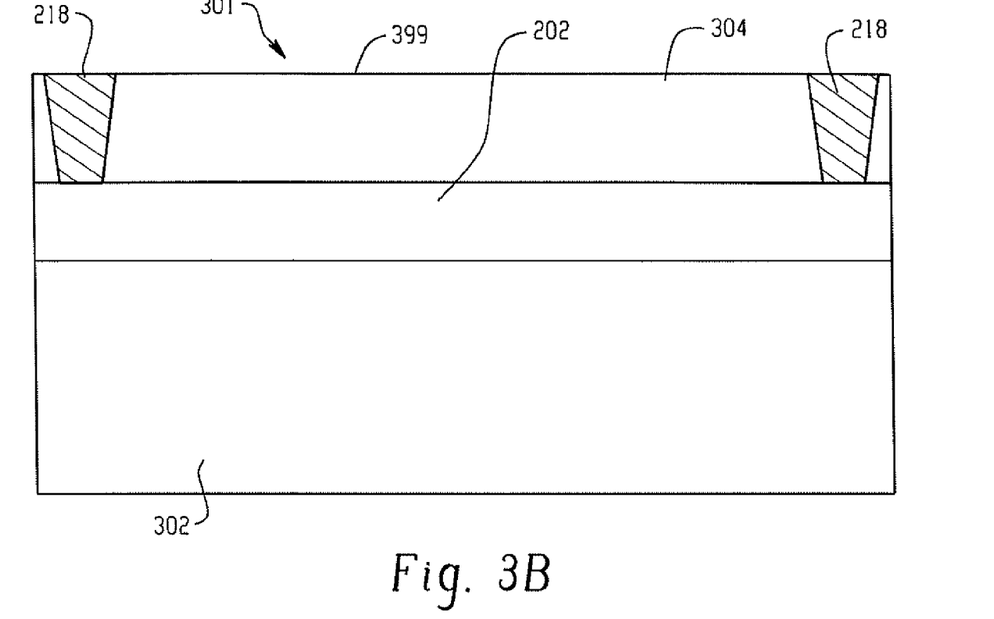
Figure 3C:
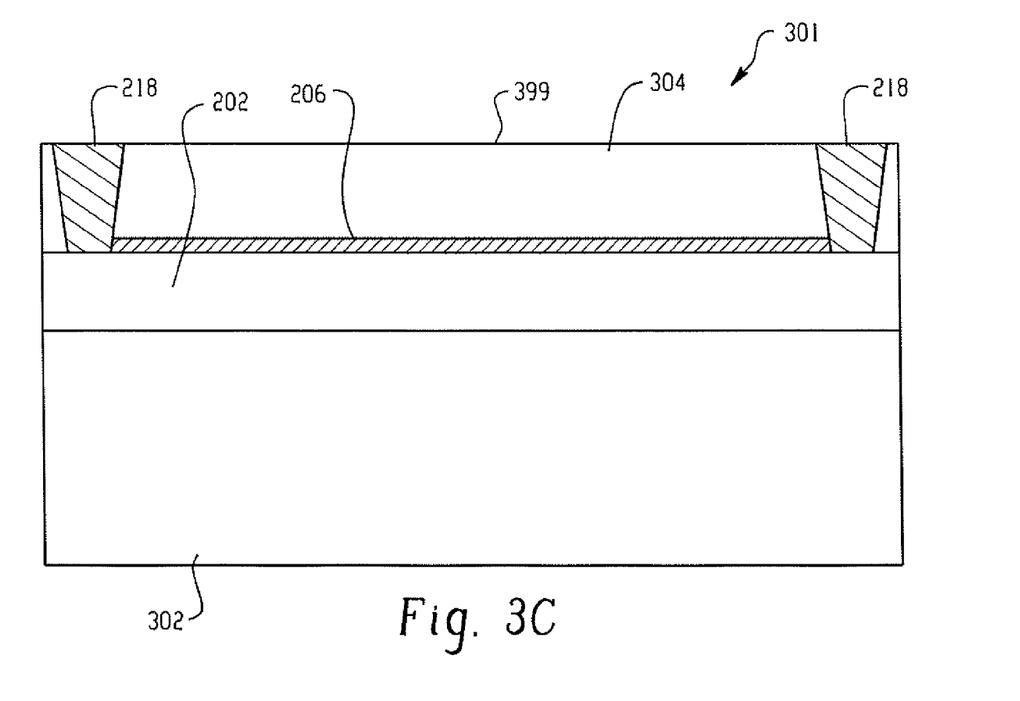
Figure 3D:
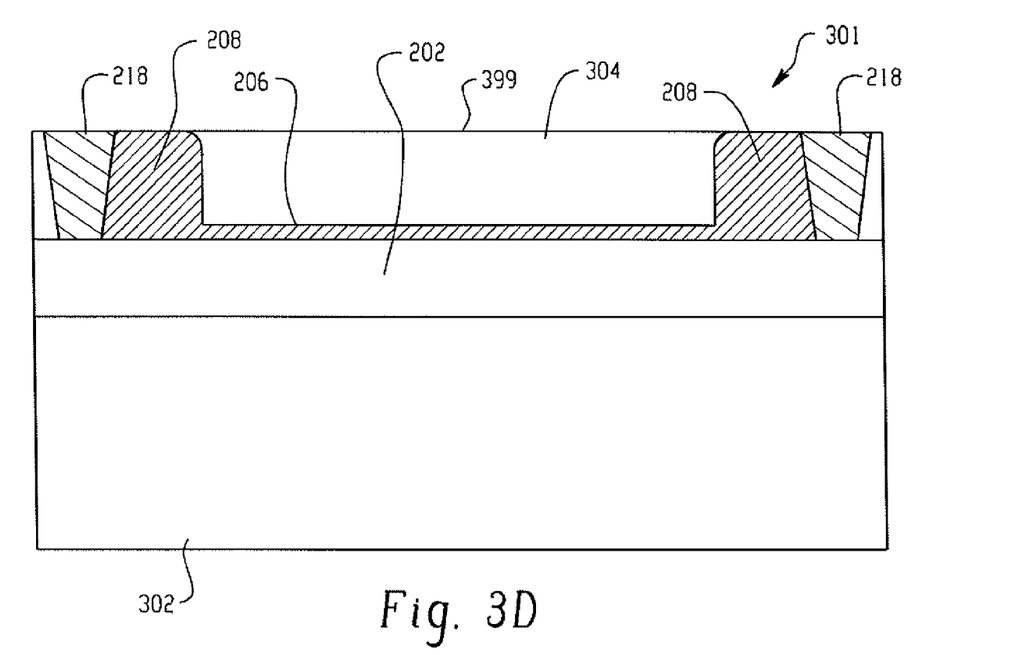
Figure 3E:
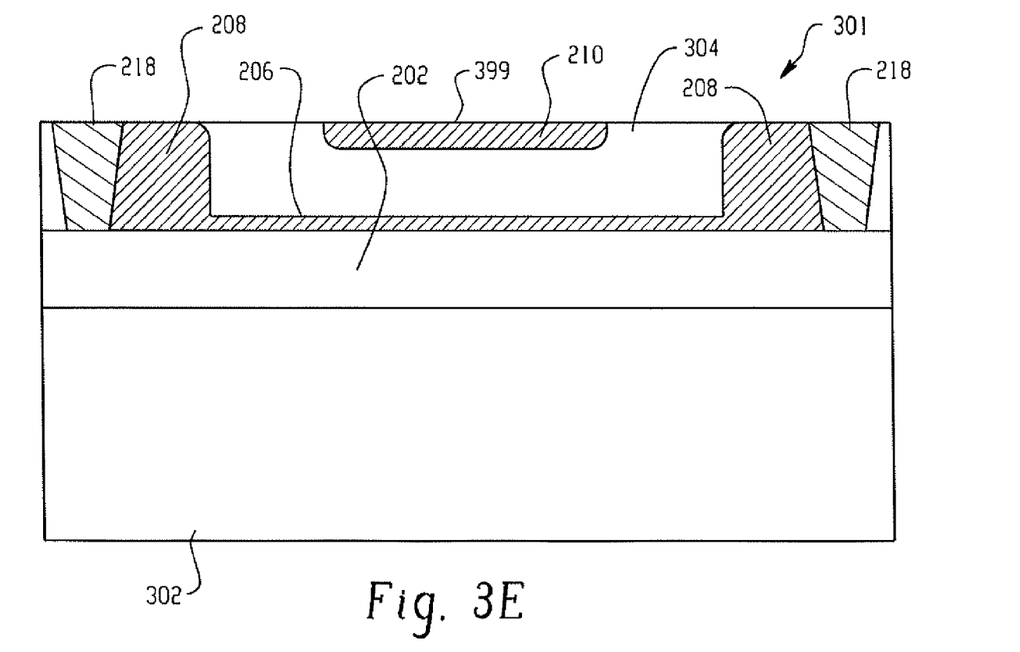
Figure 3F:
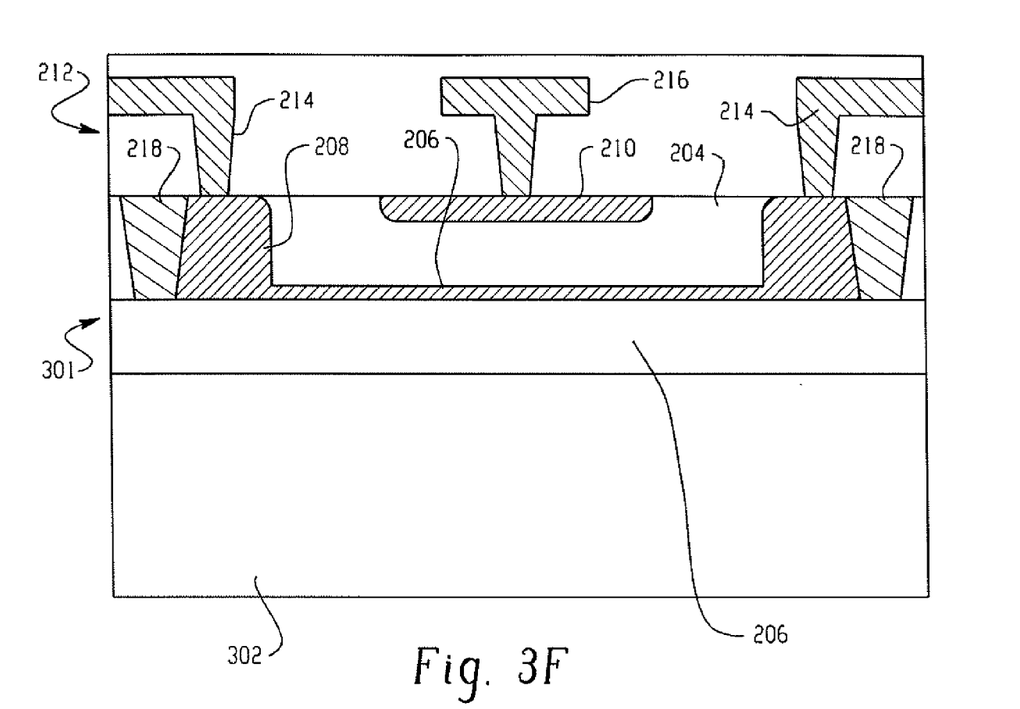
Figure 4:
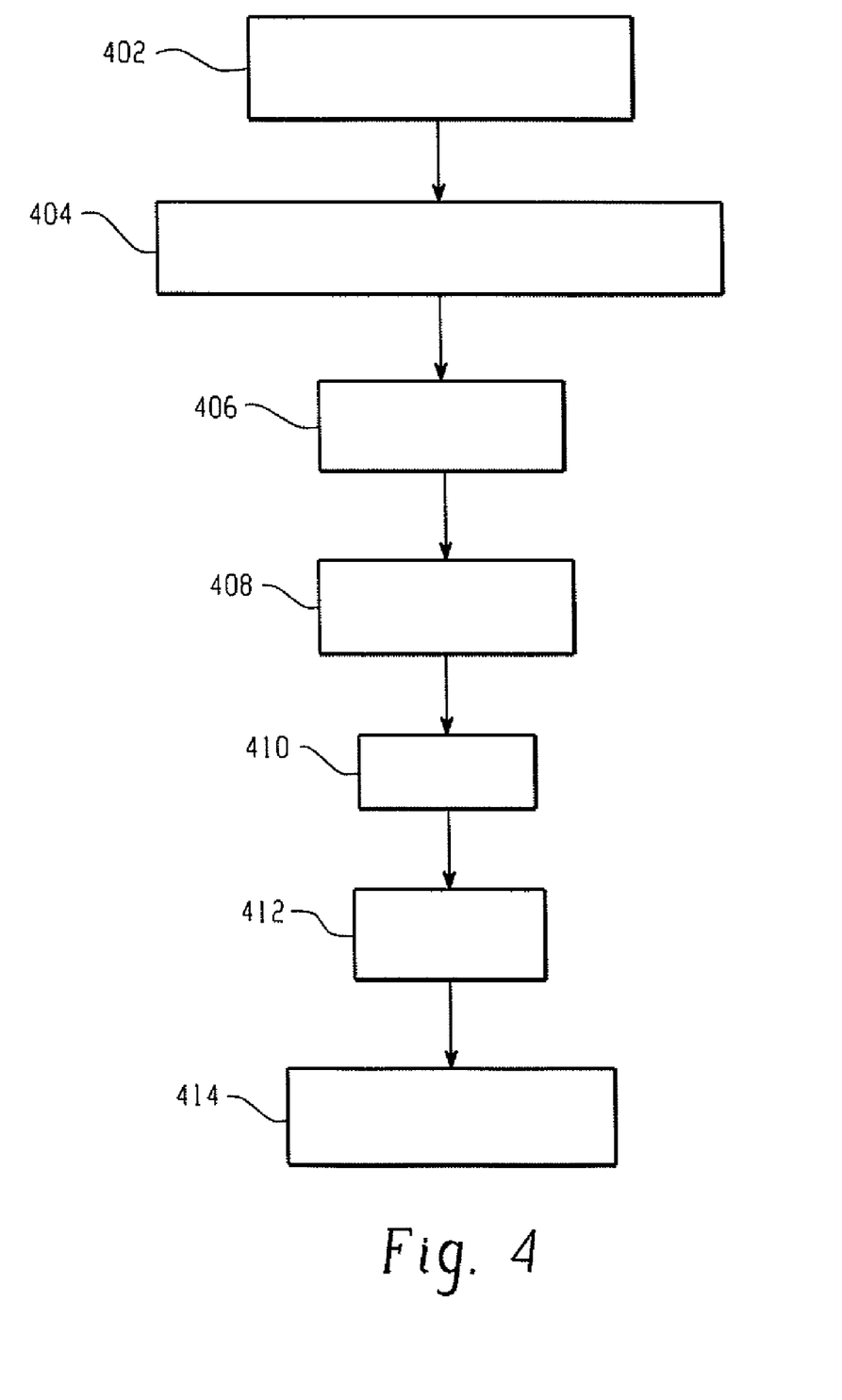
FIG. 4 depicts steps in the fabrication of a photodiode array.

FIGS. 3 and 4 describe a technique for fabricating the photodiode array 102 using a silicon on insulator (SOI) wafer 301 and a substrate transfer process. With reference to FIG. 3a, SOI wafers 301 conventionally include a silicon substrate 302, a silicon dioxide ($SiO_2$) or other buried oxide insulating layer 202 and a silicon layer 304. A particular advantage of SOI wafers is that conventional processing techniques (e.g., CMOS processing techniques) can be used to produce the photodiodes 100. Moreover, desired signal processing circuitry may also be readily incorporated on the SOI wafer as part of the fabrication process. While the fabrication technique is described in relation to an SOI wafer 301, other fabrication techniques which provide the desired photodiode 100 structure may also be implemented.

The isolation regions 218 are fabricated at 402. Where the isolation is provided by way of trench isolation, a desired mask is applied, and the trenches are etched (preferably reaching the insulating layer 202) and filled with a dielectric. Local oxidation of silicon (LOCOS) or other isolation techniques are also contemplated. A chemical mechanical polishing (CMP) operation is also applied to the top surface of the silicon layer 304. A cross section of the wafer 301 showing isolation regions 218 for an exemplary photodiode 100 is shown in FIG. 3b.

At 404, and with reference to FIG. 3c, the wafer 301 is treated to reduce the effects of lattice imperfections at the interface between the insulating layer 302 and the silicon layer 304. In one implementation, the doped layer 206 is formed by implanting dopant ions from the front side 399 of the wafer 301. Note that this layer need not be masked. As noted above, chemical passivation or other suitable techniques may also be implemented. Step 404 may also be omitted, especially where the SOI wafers are of sufficiently high quality or have otherwise been processed during fabrication to minimize interface traps.

At 406, and with reference to FIG. 3d, the first doped region 208 is formed by applying a desired mask and implanting dopant ions. At 408, and with reference to FIG. 3e, the second doped region 210 is similarly formed. Additional signal processing or other circuitry may also be implemented, as desired. An annealing operation is performed at 410.

Figure 5:
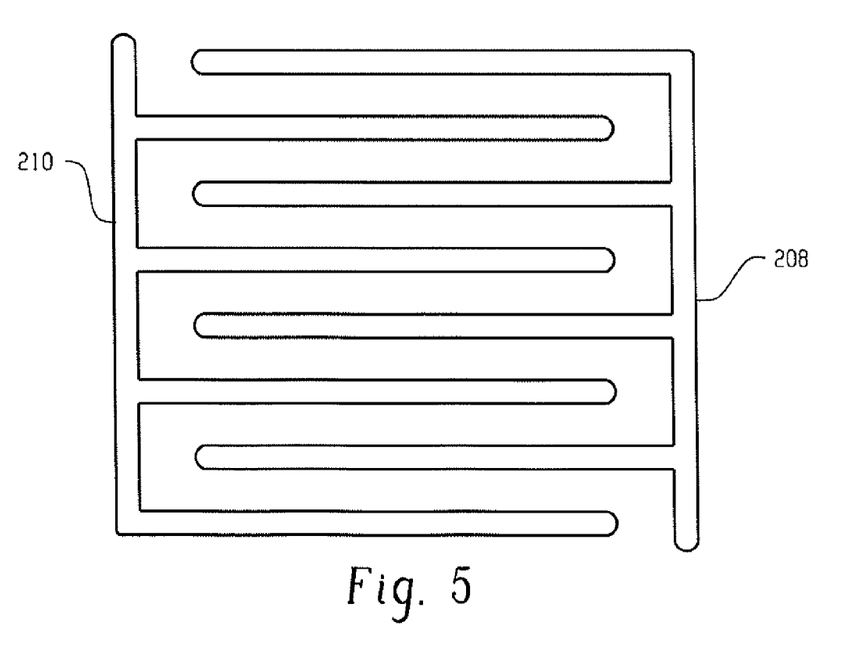
FIG. 5 depicts as mask design for a photodiode.

Note that various alternative photodiode 100 configurations are possible. Thus, for example, the first 208 and second 210 doped regions may have the generally annular configuration depicted in FIG. 2. The first 208 and second 210 regions may also be interdigitated, for example as depicted in FIG. 5.

At 412, and with reference to FIG. 3f, the interconnection layer 212 and electrodes 214, 216 are fabricated in a back-end processing step.

At 414, a substrate transfer operation is performed such that the interconnect layer 212 is affixed to the carrier substrate 217 and the silicon substrate 302 of the SOI wafer 301 is removed, thus producing the structure depicted in FIG. 1. A suitable technique for performing the substrate transfer operation is described in U.S. Pat. No. 6,177,707, issued Jan. 23, 2001 and entitled Semiconductor Device Comprising a Glass Supporting Body onto Which a Substrate with Semiconductor Elements and a Metallization is Attached by Means of an Adhesive, which is expressly incorporated by reference herein in its entirety.

More particularly, the interconnect layer 212 is glued to the carrier substrate 217 using an epoxy, acrylate, or other suitable adhesive. Advantageously, the adhesive includes a solvent-free monomer to which a UV-sensitive initiator has been added. The monomer cross-links on exposure to UV, and forms an acrylic layer having a thickness in the range of about 5 to 15 μm. The substrate 302 is then removed down to the insulating layer 202. To this end, substrate is subjected to a CMP operation, which is continued until the distance to the insulating layer 202 is only a few tens of μm, whereafter the insulating layer is exposed in an potassium hydroxide (KOH) etch bath. The etching treatment stops when the insulating layer 202 is reached. Where a non-SOI based wafer is used, backside lithography can be used to selectively remove the substrate 302.

Figure 6:
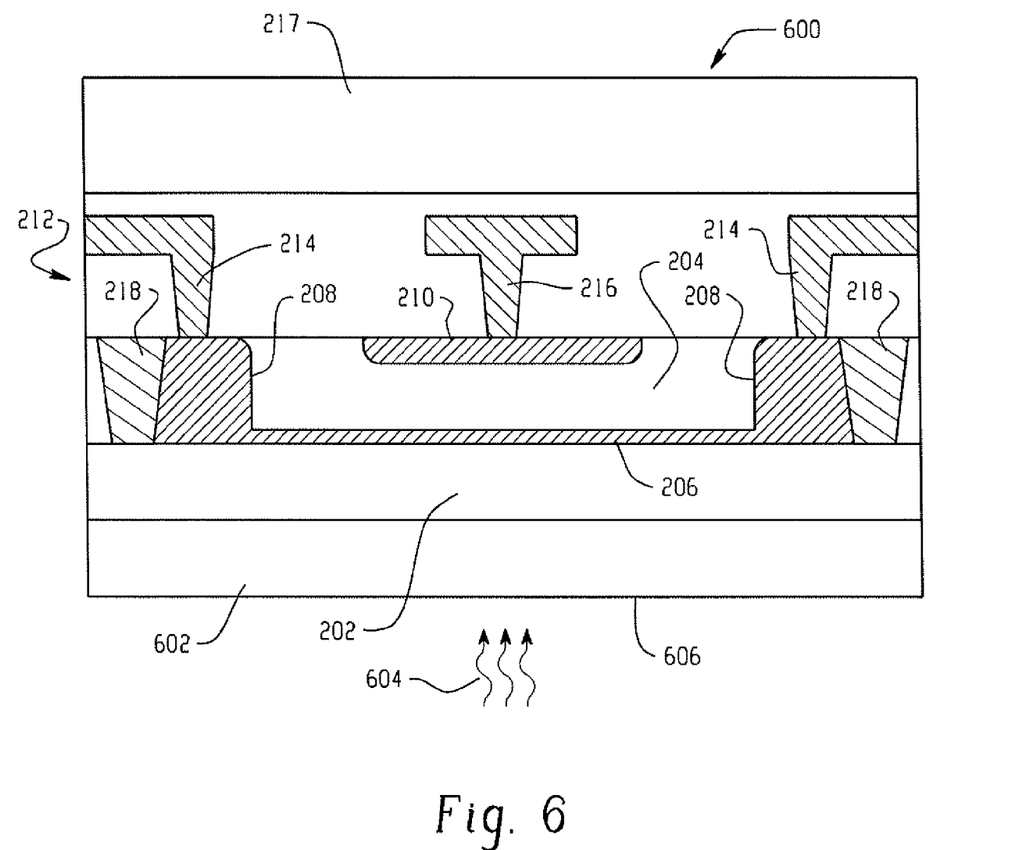
FIG. 6 is a cross sectional view of a radiation detector.

With reference to FIG. 6, a radiation detector array 600 especially well suited for use as an ionizing radiation detector includes a scintillator material 602 which is optically coupled to the insulating layer 202. Light generated by the scintillator 602 in response to radiation 604 received at the radiation receiving face 604 of the scintillator 602 is received by the photodetector 100. In positron emission tomography (PET) applications, relatively faster scintillator materials such as lutetium yttrium olthosilicate, (LYSO), lutetium orthosilicate (LSO) and lanthanum bromide (LaBr) can advantageously be used to provide time of flight (TOF) information. LySO and LSO emit light having a wavelength of approximately 420 nm, LaBr emits light having a wavelength of approximately 370 nm. As will be appreciated, both are in the blue end of the visible spectrum.

Other suitable scintillators, such as gadolinium oxysulfate (GOS), sodium iodide (NaI), gadolinium silicate (GSO), bismuth germinate (BGO), mixed lutetium silicate (MLS), lutetium gadolinium silicate (LOSO), and lanthanum chloride (LaCl), and mixtures thereof, are also contemplated depending on the requirements of a particular application. As will be appreciated by those skilled in the art, the choice of scintillator 602 and the relative thicknesses of the scintillator 602 and the insulating layer 202 are preferably tuned to provide a desired scintillator 602 conversion efficiency and insulating layer light transmission.

In operation, the photodiodes 100 are preferably reverse-biased somewhat above the diode breakdown voltage, which in the illustrated embodiment is in the range of five to ten volts direct current (5 to 10 VDC); the photodiodes 100 may also be operated in the avalanche mode below the breakdown voltage. In any case, all or substantially all of the depletion region 204, and especially the portion of the depletion region 204 in which relatively shorter wavelength incident photons are absorbed, is maintained in a depleted state.

Where the device includes a scintillator 602, incident radiation 604 is received by the scintillator 602, which generates corresponding light pulses. In the case of LYSO, LSO or LaBR scintillators, the photons have a wavelength in the blue end of the visible spectrum.

The resulting photons first encounter the insulating layer 202 and the doped layer 206. As the insulating layer 202 and the doped layer 206 are preferably relatively thin, a relatively large number of the photons pass through these layers and are absorbed in the depletion region 204.

These photons are absorbed in the depletion region 204, thus generating electron-hole pairs. The electron-hole pairs encounter the electric field established in the depletion region 204 and, through the impact ionization process, generate additional electron hole pairs. This process is repeated to generate a so-called avalanche. The electron-hole pairs are collected at the first 208 and second 210 doped regions, thus creating an electrical output current.

Note that increasing the portion of photon absorption which occurs in the depletion region 204 serves to improve the photodiode 100 quantum efficiency and speed relative to conventional devices, as electron hole pairs need not diffuse to the depletion region 204 in order to initiate an avalanche. To this end, the volume of the depletion region 204 is preferably small enough so that most of the depletion region 204, and especially the portion of the depletion region 204 in which incident photons 220 having a relatively shorter wavelength are absorbed, is depleted during operation of the photodiode 100. Reducing the distance between the first 208 and second 210 doped regions further reduces the distance which must be traversed by the avalanche, also increasing the speed of the device. Moreover, the back illuminated design improves the area utilization of the array 102, which is limited principally by the area occupied by the isolation regions 218. As a result, photodiode arrays 102 having an area utilization of ninety percent (90%) or more may be implemented through appropriate photodiode 100 and isolation region 218 design.

Where the photodiode 100 is maintained in the Geiger mode, the current generated by a given photodiode 100 due to an avalanche is relatively independent of the photon flux. The current is subsequently quenched and the diode is returned to the steady-state until additional light is received. As the current generated by a given photodiode 100 due to an avalanche is relatively independent of the photon flux, the outputs from a plurality of photodiodes are used to provide a signal indicative of the flux received in the area covered by the array 102. Where the photodiodes 100 are operated in the avalanche mode but below the breakdown voltage, on the other hand, the photocurrent generated by a given photodiode 100 is generally proportional to the incident photon flux.

Figure 7:
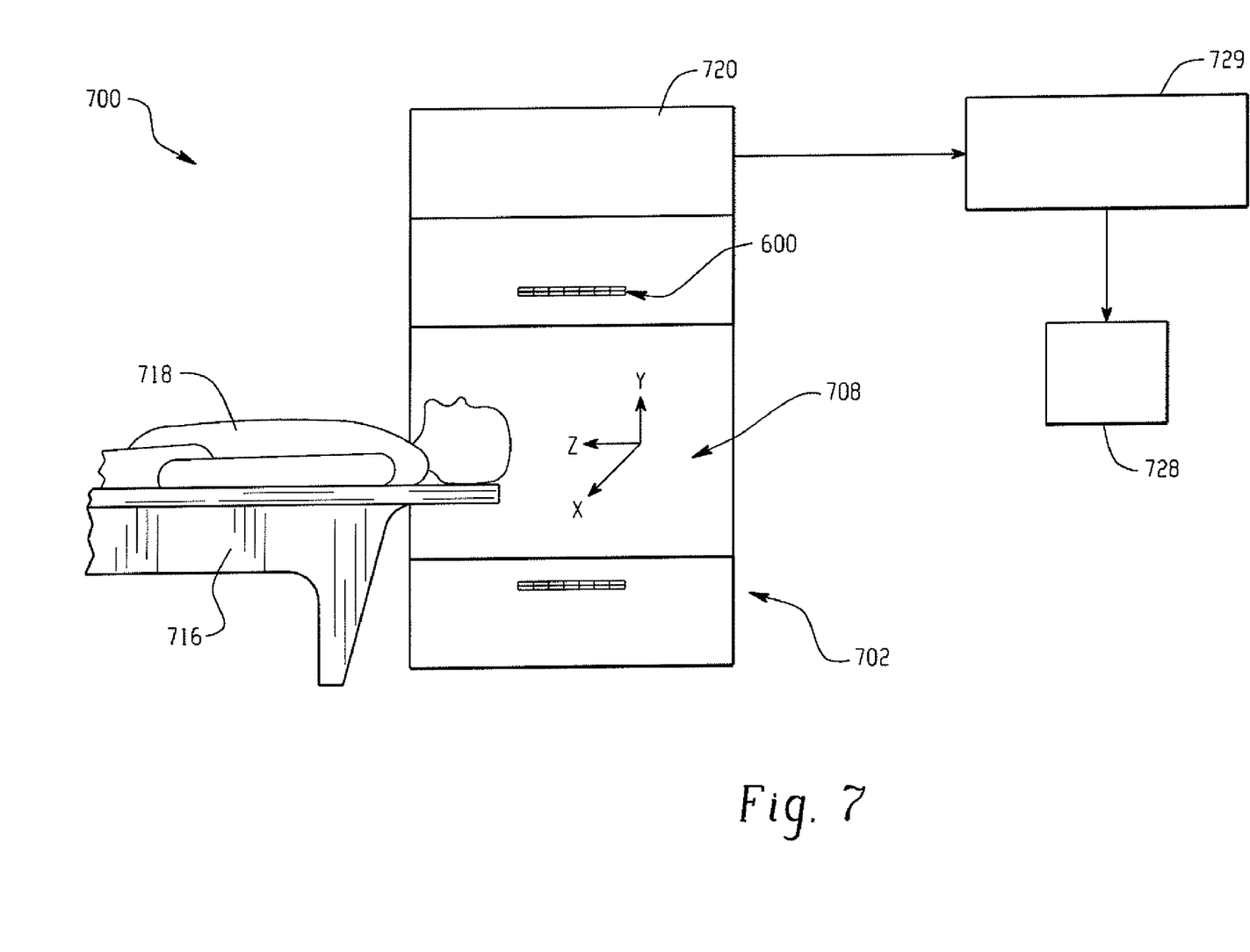
FIG. 7 depicts a positron emission tomography scanner.

The radiation detector arrays 600 described above in relation to FIG. 6 above are particularly well suited for use in a PET system. With reference to FIG. 7, a PET system 700 includes a gantry 702 having a plurality of detector arrays 600 disposed in one or more axial rings which surround an examination region 708. In a PET application, the detector arrays 600 are used in connection with coincidence detection circuitry to detect 511 keV gamma ray pairs generated by positron annihilation events occurring in the examination region 708.

An object support 716 supports an object to be imaged 718, such as a human patient. The object support 716 is preferably longitudinally movable in coordination with operation of the PET system 700 so that the object 718 can be scanned at a plurality of longitudinal locations.

A data acquisition system 720 provides projection data which includes a list of annihilation events detected by the detector arrays 600. The projection data may also include TOF information. A reconstructor 729 generates volumetric image data indicative of the distribution of the radionuclide in the object 718.

A workstation computer serves as an operator console 728. The console 728 includes a human readable output device such as a monitor or display and input devices such as a keyboard and mouse. Software resident on the console 728 allows the operator to view and otherwise manipulate the volumetric image data generated by the reconstructor 729. Software resident on the console 728 also allows the operator to control the operation of the system 700 by establishing desired scan protocols, initiating and terminating scans, and otherwise interacting with the scanner. Reconstructed image data may also be made available to other computers associated with the system 100 or otherwise having access to a common network such as a picture archiving and communication (PACS) system, hospital information system/radiology information system (HIS/RIS) system, the internet, or the like.

Variations on the system 700 are also possible. Thus, for example, the PET system 700 may be combined with a computed tomography (CT), magnetic resonance (MR), x-ray or other system. The additional information is typically used to provide structural information about the object 718, and can be used to perform attenuation correction on the acquired PET data.

Moreover, individual detectors or detector arrays 600 may be used to detect radiation other 511 keV gamma radiation, and in other than tomographic applications. For example, the detectors may be used in nuclear imaging systems such single photon emission computed tomography (SPECT), x-ray computed tomography (CT), or x-ray imaging systems. The detectors may also be used in fluorescence or other optical imaging systems. The detector arrays 600 may also be disposed in a planar, arcuate or other non-circular arrangement. Where the objective is to detect light radiation, the scintillator 602 may also be omitted.

Of course, modifications and alterations will occur to others upon reading and understanding the preceding description. It is intended that the invention be construed as including all such modifications and alterations insofar as they come within the scope of the appended claims or the equivalents thereof.

The invention claimed is:

1. An avalanche photodiode comprising:
   a semiconductor depletion region;
   an anode;
   a cathode;
   wherein incident photons having a wavelength in the blue end of the visible spectrum are absorbed in the depletion region so as to generate charge carriers, and wherein the charge carriers undergo impact ionization in the depletion region so as to generate an avalanche current in the photodiode.

2. The photodiode of claim 1 wherein the photodiode comprises a light receiving face and an electrically insulative layer, and wherein the electrically insulative layer is disposed between the light receiving face and the depletion region.

3. The photodiode of claim 2 wherein the electrically insulative layer is fabricated from the buried oxide layer of an SOI wafer.

4. The photodiode of claim 2 comprising means for reducing an effect of lattice imperfections at an interface between the depletion region and the electrically insulative layer.

5. The photodiode of claim 4 wherein the means for reducing comprises a thin doped semiconductor layer.

6. The photodiode of claim 2 wherein the photodiode is back illuminated.

7. The photodiode of claim 2 wherein the photodiode comprises:
   a handle wafer;
   an interconnection layer disposed physically between the depletion region and the handle wafer.

8. The photodiode of claim 1 including a scintillator in optical communication with the depletion region.

9. The photodiode of claim 8 wherein the scintillator comprises one of LySO, LSO, LGSO or LaBr.

10. The photodiode of claim 1 wherein the anode and cathode are interdigitated.

11. A method of manufacturing an array of avalanche photodiodes using a silicon on insulator wafer, which wafer includes a substrate, a silicon layer, and a buried oxide layer disposed physically between the substrate and the silicon layer, the method comprising:
    forming a plurality of avalanche photodiodes in the silicon layer, the photodiodes including an anode, a cathode, and a depletion region;
    forming a plurality of electrodes in electrical communication with the anodes and cathodes of respective photodiodes, wherein the plurality of electrodes are disposed on a side of the silicon layer which is opposite the buried oxide layer;
    forming a plurality of isolation regions by etching a plurality of trenches which extend to the buried oxide layer which isolates each of the plurality of photodiodes from adjacent photodiodes; and
    removing the substrate, whereby the photodiodes are illuminated through the buried oxide layer.

12. The method of claim 11 further comprising attaching a handle wafer to the array, wherein the plurality of electrodes are disposed physically between the handle wafer and the silicon wafer.

13. The method of claim 11 including forming an isolation region which provides electrical isolation between photodiodes in the array.

14. The method of claim 13 wherein the isolation region is formed using a local oxidation of silicon technique.

15. The method of claim 11 including forming an implantation layer at an interface between the buried oxide layer and the silicon layer.

16. The method of claim 11 including placing a scintillator in optical communication with the buried oxide layer.

17. An ionizing radiation detector produced using the method of claim 16.

18. A photodiode array produced using a silicon on insulator wafer, which wafer includes a substrate, a silicon layer, and a buried oxide layer disposed physically between the substrate and the silicon layer, wherein the photodiode array is produced using a process comprising:
    forming a plurality of avalanche photodiodes in the silicon layer, the photodiodes including an anode, a cathode, and a depletion region;
    forming a plurality of electrodes in electrical communication with the anodes and cathodes of respective photodiodes, wherein the plurality of electrodes are disposed on a side of the photodiodes opposite the buried oxide layer;
    attaching a handle wafer to the silicon on insulator wafer, wherein the electrodes are disposed physically between the handle wafer and the photodiodes;
    forming a plurality of isolation regions by etching a plurality of trenches which extend to the buried oxide layer which isolates each of the plurality of photodiodes from adjacent photodiodes; and
    removing the substrate from the silicon on insulator wafer, whereby the photodiodes are illuminated through the buried oxide layer.

19. The photodiode of claim 18 wherein the process further comprises forming an isolation trench which extends between the interconnection layer and the buried oxide layer.

20. An avalanche photodiode comprising:
a first doped semiconductor region which forms a cathode of the photodiode;
a second doped semiconductor region which forms an anode of the photodiode;
a third semiconductor region in optical communication with a light receiving face of the photodiode, wherein substantially all of the third semiconductor region is depleted when the photodiode is operated in the avalanche mode;
an interconnection layer including a first electrode in electrical communication with the first doped semiconductor region and a second electrode in electrical communication with the second doped semiconductor region, wherein the third semiconductor region is disposed physically between the interconnection layer and the light receiving face.

21. The photodiode of claim 20 wherein the first doped semiconductor region, the second doped semiconductor region, and the third semiconductor region form one of a pπn or a pvn photodiode.

22. The photodiode of claim 21 wherein the third semiconductor region has a thickness of less than about 500 nm.

23. The photodiode of claim 20 including an isolation trench which surrounds the photodiode.

24. The photodiode of claim 20 including an electrically insulative layer disposed between the third semiconductor region and the light receiving face.

25. The apparatus of claim 24 wherein the electrically insulative layer comprises silicon dioxide and wherein the electrically insulative layer is substantially transmissive of light having a wavelength in the blue end of the optical spectrum.

26. The apparatus of claim 25 including a passivation layer disposed at an interface between the third semiconductor region and the electrically insulative layer.

27. The apparatus of claim 20 including a handle wafer disposed on a side of the photodiode opposite the light receiving face.

28. The apparatus of claim 27 wherein the handle wafer comprises glass.

29. The apparatus of claim 20 wherein the first and second doped semiconductor regions are concentric.

30. The apparatus of claim 20 including a scintillator in optical communication with the third semiconductor layer.

31. An apparatus comprising:
an examination region;
an object support adapted to support an object under examination in the examination region;
a radiation detector array including:
a radiation sensitive face which faces the examination region;
an array of avalanche photodiodes, wherein each photodiode includes an anode, a cathode, and a depletion region, wherein photons absorbed in the depletion region of a photodiode generate charge carriers, and wherein the charge carriers undergo impact ionization in the depletion region of the photodiode so as to generate an avalanche current in the photodiode;
an interconnection layer including a plurality of electrodes which provide electrical connections to the photodiodes, wherein the interconnection layer is disposed on a side of the photodiode array which is opposite the radiation receiving face, and wherein the interconnection layer contains a quenching resistor.

32. The apparatus of claim 31 wherein the radiation detector array includes a scintillator which receives ionizing radiation from the examination region.

33. The apparatus of claim 32 wherein the scintillator includes one of lutetium and lanthanum.

34. The apparatus of claim 31 wherein the avalanche photodiodes are operated in the Geiger mode.

* * * * *